United States Patent
Murata et al.

(10) Patent No.: US 6,186,723 B1
(45) Date of Patent: Feb. 13, 2001

(54) LOAD PORT

(75) Inventors: Masanao Murata; Hiroyuki Oyobe; Tsuyoshi Tanaka; Zenta Nanpei; Toshiyuki Takaoka, all of Ise; Hiroaki Saeki; Keiichi Matsushima, both of Nirasaki, all of (JP)

(73) Assignees: Shinko Electric Co., Ltd.; Tokyo Electron Limited, both of Tokyo (JP)

( * ) Notice: Under 35 U.S.C. 154(b), the term of this patent shall be extended for 0 days.

(21) Appl. No.: 09/282,703

(22) Filed: Mar. 31, 1999

(30) Foreign Application Priority Data

Apr. 3, 1998 (JP) .................................................. 10-091972

(51) Int. Cl.[7] .................................................. B65G 49/07
(52) U.S. Cl. .......................... 414/217; 414/939; 414/940
(58) Field of Search ................................ 414/217.1, 217, 414/939, 940; 220/331

(56) References Cited

U.S. PATENT DOCUMENTS

| | | | | |
|---|---|---|---|---|
| 4,042,128 | * | 8/1977 | Shrader | 414/939 X |
| 4,169,538 | * | 10/1979 | Bird et al. | 220/334 |
| 4,698,938 | * | 10/1987 | Huber | 49/138 |
| 4,918,864 | * | 4/1990 | Lunenschloss et al. | 49/137 |
| 5,364,219 | * | 11/1994 | Takahashi et al. | 414/939 X |
| 5,829,939 | * | 11/1998 | Iwai et al. | 414/940 X |

FOREIGN PATENT DOCUMENTS

4123430 * 4/1992 (JP) ...................................... 414/939

* cited by examiner

Primary Examiner—Steven A. Bratlie
(74) Attorney, Agent, or Firm—Darby & Darby (57) ABSTRACT

A load port for semiconductor equipment includes a transporting apparatus 18 and/or a moving apparatus 30 for respectively transporting a carrier base 14 and moving a cover 15, using a smaller force until the carrier base 14 and/or the cover 15 reaches a predetermined position that is at a predetermined distance from an opening 16 of the equipment. This position is at a distance where it is no longer possible to catch a hand or other object between the carrier base 14 or cover 15 and the semiconductor equipment. Then, the carrier base 14 and/or the cover 15 is transported or moved towards the opening 16 by the transporting apparatus 18 and/or moving apparatus 30 respectively transporting the carrier base 14 and/or moving the cover 15 towards the opening 16 to completely close the opening 16 using a larger force.

9 Claims, 10 Drawing Sheets

FIG.2 (b) CLOSING OPERATION

FIG.3

FIG.4 (a) OPENING OPERATION

FIG. 4 (b) CLOSING OPERATION

LOAD PORT

BACKGROUND OF THE INVENTION

1. Field of the Invention

The present invention relates to a load port for semiconductor manufacturing equipment used in the production of semiconductors, semiconductor devices, and the like. This application is based on the patent application No. Hei 10-91972, filed in Japan, the content of which is incorporated herein by reference.

2. Description of the Related Art

Figure 7:
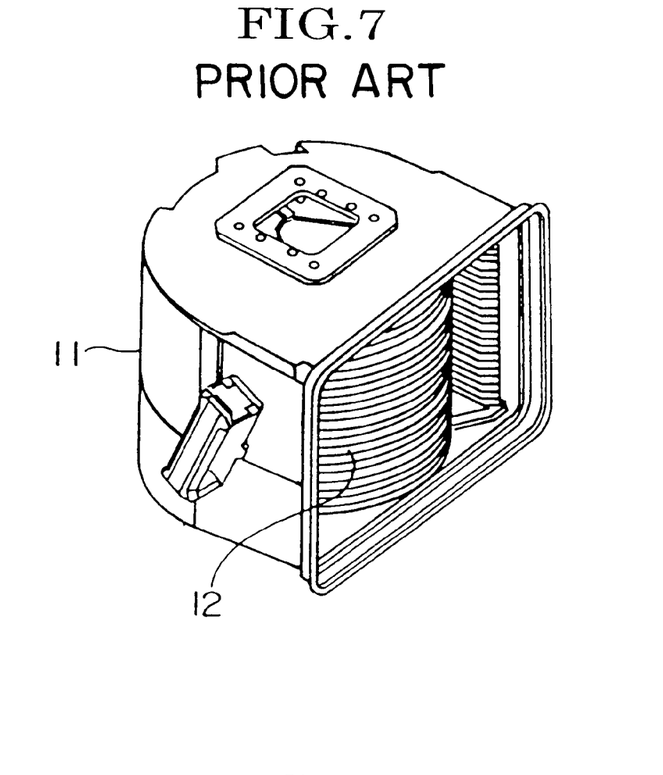
FIG. 7 is a cross-sectional view showing an example of a carrier for use in transporting wafers.
Figure 8:
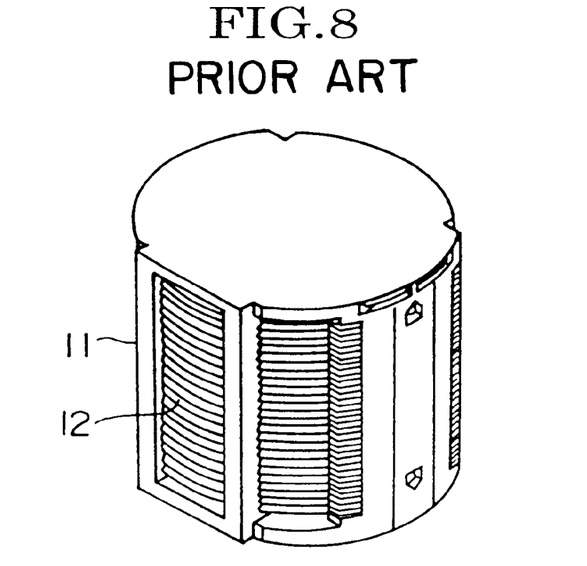
FIG. 8 is a cross-sectional view showing an example of a carrier for use in transporting wafers.

In order to manufacture high quality semiconductor devices in an economical manner, there has been a trend towards increasing the size of the wafer diameter. For example, a front-opening unified pod (FOUP) type carrier 11, shown in FIG. 7 (the embodiment in the figure displays a FOUP carrier with its cover removed), an open cassette (OC) type carrier 11, shown in FIG. 8, and the like, are being used as carriers for transporting wafers in semiconductor manufacturing equipment which handle wafers possessing diameters greater than 300 mm.

Figure 9:
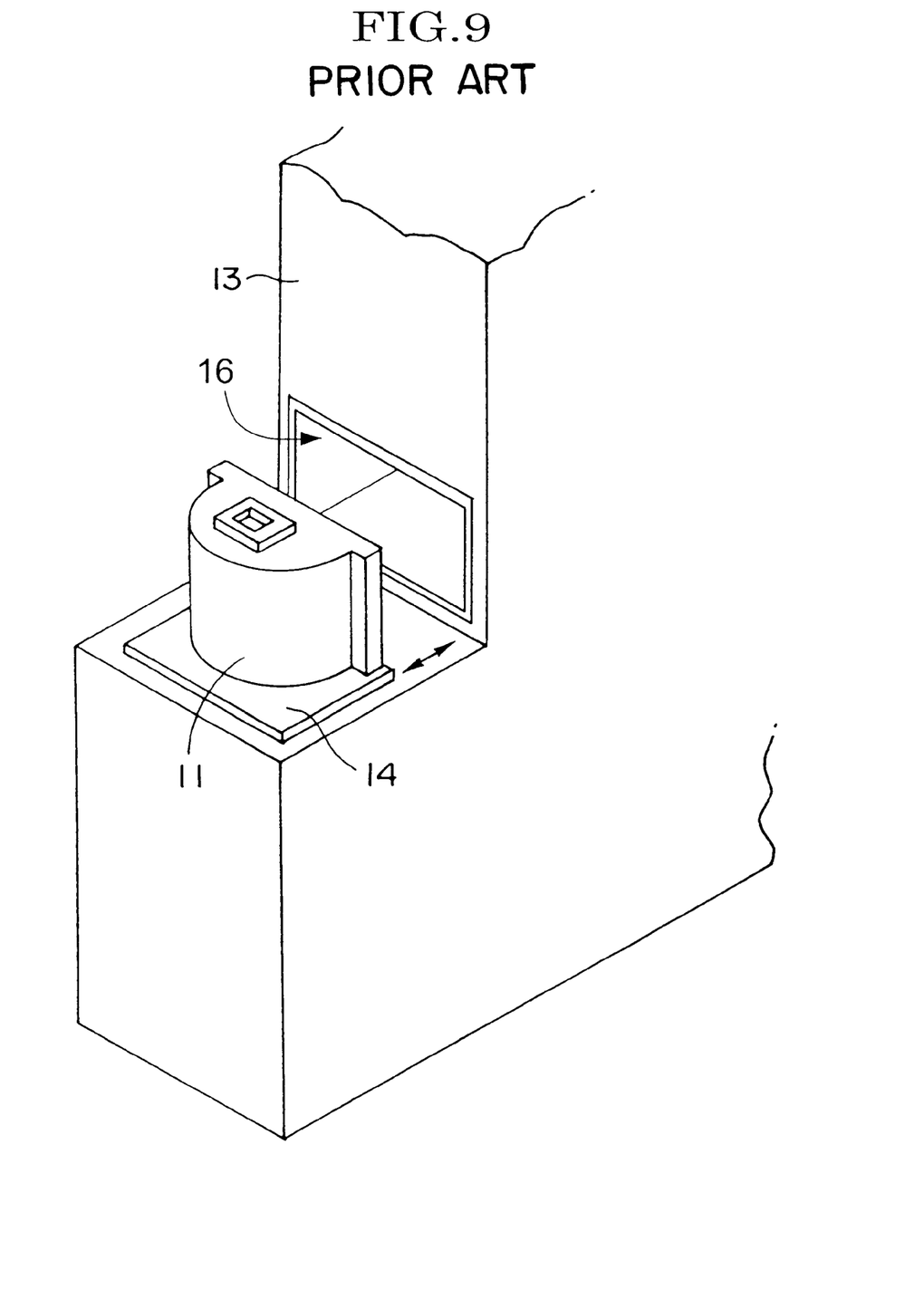
FIG. 9 is a cross-sectional view s showing the structural outline of a load port used in conventional semiconductor manufacturing equipment.

The peripheral structure of a load port in conventional semiconductor manufacturing equipment is typically described in FIG. 9. In FIG. 9, a wafer 12, accommodated in a carrier 11 for wafers (hereinafter, referred to as carrier 11), such as an FOUP carrier shown in FIG. 7, and the like, is transported to a load port for processing wafers in semiconductor manufacturing equipment 13 (hereinafter, referred to as equipment 13), either manually or by an automated transporter, and loaded onto a movable, carrier base 14, which is stationed at the load port. Additionally, an opening 16 for the wafer 12 is provided in the equipment 13. The opening 16 is usually closed with a cover 15 (described below). When the cover 15 is opened, it is possible to move the wafer 12 in and out between the carrier 11 and the equipment 13 through the aforementioned opening 16, or alternatively store the wafer 12 together with the carrier 11 inside the equipment 13 through the opening 16.

The carrier 11, which has been transported to the load port, is loaded onto a carrier base 14, which has been positioned in front of the opening 16. This carrier base 14 can move further away from, as well as towards the opening 16. The carrier 11 is loaded onto the carrier base 14 at a position that is a short distance away from opening 16, and is transported towards the opening 16, together with the carrier base 14. In general, with respect to a FOUP carrier, the cover 15 of the opening 16 is designed to open with carrier 11, loaded onto the carrier base 14, pushed against the front surface of the equipment 13. Thereafter, the wafer 12 housed within the carrier 11 is removed.

The force of pushing the carrier 11 against the front surface of the equipment 13 is set to a minimum. However, since a positive pressure exists within the equipment 13 to prevent dust from entering, the force of carrier exerted against the front surface of the equipment must be at least large enough to overcome this pressure. For example, if the equipment 13 possesses an inner capacity of 50 mm of water, and a FOUP (i.e., carrier 11), accommodating 25 sheets of wafers 12, possesses a projected surface area against the equipment 13 of 300 mm×350 mm, a force of at least 5.25 kg is required to push the carrier 11 against the equipment 13. Furthermore, in the case when, in order to prevent oxidation of the wafer 12, the interior of the equipment 13 is filled with an inert gas such as nitrogen, argon, dry air, or the like, a sealing material is required in between the equipment 13 and the carrier 11 to prevent this gas from leaking. In such a case, the carrier 11 pushes up against the equipment 13 through this sealing material, and thus a greater force is required.

Thus, in order to obtain the aforementioned required force, a device that possesses the capability of generating this force is used as an actuator for moving the carrier 11. Therefore, in the case when the carrier 11 is transported towards the opening 16, the actuator continuously operates, driving the carrier 11 against the opening 16 with the required force.

However, the aforementioned force is actually required only during the final step, and is not necessary throughout the entire process. Moreover, when the carrier 11 is transported together with the carrier base 14 using an excessively large force, extreme caution must be maintained during operation, as a substantial risk of injury exists via a projection or the like, in such cases as when a hand is caught in between the carrier 11 and the equipment 13 during transportation. In addition, for the same reasons, extreme caution must be exercised, not only while pushing the carrier 11 against the opening 16, but also when closing the opening 16 with the cover 15 using a large force.

In consideration of the above problems, it is an object of the present invention to provide a load port that possesses a highly safe structure in order to prevent injuries due to a lack of caution.

SUMMARY OF THE INVENTION

A load port according to the present invention comprising a transporting means and/or a moving means for respectively transporting a carrier base and moving a cover, using a smaller force until the carrier base and/or the cover reaches a predetermined position that is a predetermined distance from an opening, where it is no longer possible to catch a hand or the like between the carrier base or cover and the semiconductor equipment. Then, the carrier base and/or the cover is transported or moved towards the opening, the transporting means and/or moving means respectively transporting the carrier base and/or moving the cover, towards the opening to completely close the opening using a larger force.

BRIEF DESCRIPTION OF THE DRAWINGS

FIG. 2 (a) is a flow chart showing an example of an opening operation of the cover of the equipment shown in FIG. 1.

FIG. 2 (b) is a flow chart showing an example of an closing operation of the cover of the equipment shown in FIG. 1.

FIG. 4 (a) is a flow chart showing an example of an opening operation of the cover of the equipment shown in FIG. 3.

FIG. 4 (b) is a flow chart showing an example of an closing operation of the cover of the equipment shown in FIG. 3.

DESCRIPTION OF THE PREFERRED EMBODIMENTS

In the following, the preferred embodiments of the present invention will be described in detail using figures. The following embodiments include applicable concrete examples, and various technically preferred limitations. However, the present invention is not limited to these embodiments, and modifications are possible as long as there is no proviso contained in the following descriptions.

First Embodiment

Figure 1:
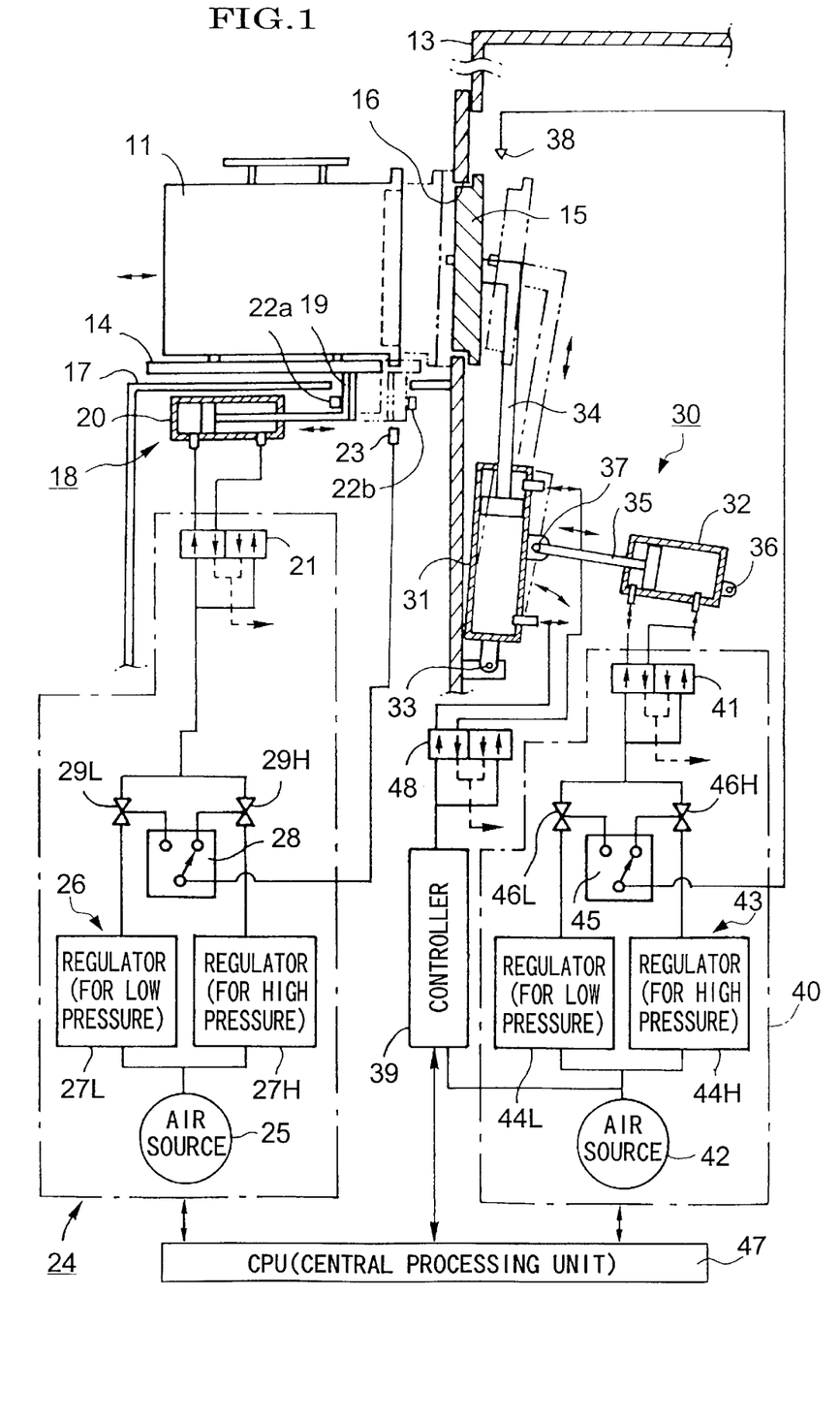
FIG. 1 is a diagram showing the structural outline of a load port for semiconductor manufacturing equipment according to a first embodiment of the present invention.

FIG. 1 is a diagram showing the structural outline of a load port for semiconductor manufacturing equipment according to a first embodiment of the present invention. The structural elements that are identical to those of the equipment shown in FIG. 9 are described using the same reference numbers.

In FIG. 1, an opening 16, which is opened or closed by means of a cover 15, is provided on the front surface of equipment 13. A carrier base 14, onto which a carrier 11 is loaded while accommodating a wafer 12, is provided on a fixed base 17 at the front of the opening 16. The carrier base 14 is connected to a rod 19 extending from a carrier base transporting means 18, which is provided under the fixed base 17, and can move forward and backward along with the rod 19. Furthermore, a support means (not shown in the figures) is provided for supporting carrier 11 while loaded onto carrier base 14, such that the carrier 11 is removable. In this manner, the carrier 11 is capable of moving together with the carrier base 14.

The carrier base transporting means 18 is equipped with an air cylinder 20, which functions as an actuator to move the rod 19 back and forth. The air cylinder 20 is controlled by means of a direction switch valve 21 provided in a carrier base drive control means 24, which switches the position of the rod 19 between a position in which the rod 19 protrudes from the air cylinder 20, and a position in which the rod 19 is recessed into the air cylinder 20. When the carrier 11 is loaded on the carrier base 14, the rod 19 is pulled furthest into the air cylinder 20, such that the carrier base 14 is at a position furthest from the opening 16 (Hereinafter, this position is referred to as the "carrier set position"). The solid line in FIG. 1 shows the state when the carrier base 14 is positioned at the aforementioned carrier set position.

On the other hand, when the rod 19 protrudes from the air cylinder 20 by means of operating the air cylinder 20, the carrier base 14 moves towards the opening 16, synchronous with the motion of the rod 19. When the carrier base 14 is moved to a position closest to the opening 16, the opening of the carrier 11, which is loaded onto the carrier base 14, is pushed against the opening 16. This position where the opening of the carrier 11 is pushed against the opening 16 is referred to hereinafter as the "wafer exchange position". Furthermore, stoppers 22a and 22b are respectively provided to prevent carrier base 14 from passing beyond the aforementioned respective wafer exchange position and the carrier set position. These stoppers respectively collide with a portion of the rod 19, thereby limiting further movement of the carrier base 14 beyond the aforementioned positions, and are hence provided at the front and the rear of rod 19, respectively. In addition, a sensor 23, which detects and outputs a signal when the carrier 11 is transported to a position extremely close to the opening 16, is provided in the vicinity of the pathway over which rod 19 traverses.

The carrier base drive control means 24 comprises an air source 25; a pressure regulating means 26 comprising a high pressure regulator 27H and a low pressure regulator 27L, respectively, for regulating and supplying the air pressure from air source 25 to the air cylinder 20; a pressure transducer 28; a high pressure electromagnetic valve 29H; and a low pressure electromagnetic valve 29L, in addition to the aforementioned direction switch valve 21. The pressure transducer 28 alternatively switches the high pressure electromagnetic valve 29H and the low pressure electromagnetic valve 29L into an ON or OFF state, such that when one is switched ON, the other is switched OFF. When the high pressure electromagnetic valve 29H is switched ON, high pressure is imparted to the air cylinder 20 thereby providing and allowing the carrier base 14 to move with a large force. On the other hand, when the low pressure electromagnetic valve 29L is switched ON, the air cylinder 20 is provided with low pressure, and thus the carrier base 14 receives and moves with a smaller force than when the high pressure electromagnetic valve 29H is switched ON. A "large force" received by the carrier base 14 signifies a force greater than that required to keep the gas within equipment 13 from leaking at the time when the opening of carrier 11 is brought into tight contact with the aforementioned opening 16. In addition, a "small force" received by the carrier base 14 refers to a force, against which the carrier base 14 can be manually halted, for example, in the case when a hand is caught in between the equipment 13 and the carrier base 14 during transportation of the carrier 14. The specific magnitude of these forces can be optionally determined.

In the following, the cover 15 is described. The cover 15 is connected to a rod 34 extending from a cover moving means 30, installed in the equipment 13, and hence is movable together with the rod 34. The cover moving means 30 is equipped with an air cylinder 31 which moves the cover 15 in the vertical direction, and an air cylinder 32 which moves the cover 15 in the forward and reverse directions. The air cylinder 31 is supported with aforementioned rod 34, such that this rod 34 can freely move in the vertical direction, thereby allowing cover 15 to also move vertically in synchrony with the vertical motion of the rod 34. In addition, the lower end of the air cylinder 31 is supported by means of an axle 33, on which the air cylinder 31 can freely rotate. Accordingly, the air cylinder 31 rotates around the axle 33 as a fulcrum in the forward and reverse directions (i.e., direction for opening/closing), together with the cover 15.

On the other hand, the air cylinder 32 comprises a rod 35 that moves in the forward and reverse directions, the terminal end of which is connected to the air cylinder 31 via an axle 37. The base end of the air cylinder 32 is supported with an axle 36, on which the air cylinder 32 can freely rotate. When the rod 35 moves either in the forward or reverse direction, in synchrony with the motion of the rod 35, the air cylinder 31 rotates using the axle 33 as a fulcrum in the forward or reverse direction, to open/close the cover 15. Furthermore, a sensor 38 is provided directly in front of the position where the cover 15 closes the opening 16 (i.e., at a position, where a space exists, through which a hand or the like may barely pass, is maintained in between the equipment 13 and the cover 15), in order to detect the position of the cover 15. Additionally, the air cylinder 31 is controlled by means of a first cover controller 39, and a direction switch valve 48, whereas the air cylinder 32 is controlled by means of a second cover controller 40.

The second cover controller 40 comprises an air source 42; a pressure regulating means 43 comprising a high pressure regulator 44H and a low pressure regulator 44L, for regulating and supplying air pressure from an air source 42 to the air cylinder 32; a pressure transducer 45; a high pressure electromagnetic valve 46H; and a low pressure electromagnetic valve 46L, in addition to the direction switch valve 41. The pressure transducer 45 switches alternatively ON or OFF the high pressure electromagnetic valve 46H and the low pressure electromagnetic valve 46L, such that when one is switched ON, the other is switched OFF. When the high pressure electromagnetic valve 46H is switched ON, a high pressure is provided to air cylinder 32, thereby allowing the cover 15 to move with a large force. On the other hand, when the low pressure electromagnetic valve 46L is switched ON, the air cylinder 32 is provided with low pressure, and thus the cover 15 moves with a smaller force than when the high pressure electromagnetic valve 46H is switched ON. A "large force" received by the cover 15 signifies a force greater than that required to keep the gas within equipment 13 from leaking at the time when the aforementioned opening 16 is closed by cover 15. In addition, a "small force" received by the cover 15 refers to a force, against which the cover 15 can be manually halted, for example, in the case when a hand is caught in between the equipment 13 and cover 15 during movement of cover 15. The specific magnitude of these forces can be optionally determined Furthermore, the aforementioned pressure regulating means 26; the first cover controller 39; the second cover controller 40; the pressure regulating means 43; and the like are controlled by means of a program that is pre-installed in a central processing unit (CPU) 47.

Figure 2:
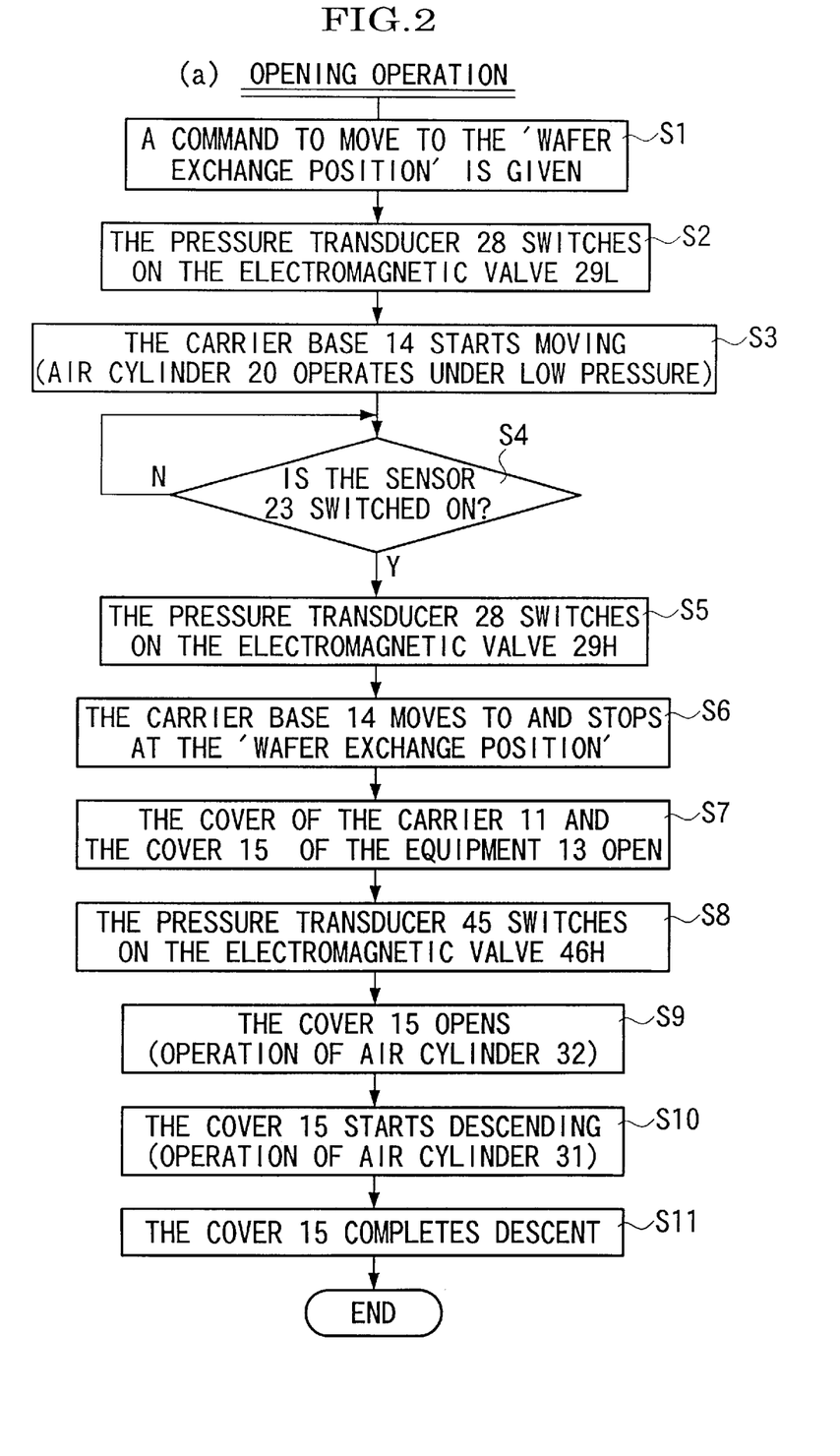

FIGS. 2 (a) and 2 (b) are flow charts showing an example of such program. The operation of each structure in the aforementioned system is described using FIGS. 2 (a) and 2 (b).

Firstly, the operation for opening the cover 15, shown in FIG. 2 (a), is described. The carrier base 14 is positioned at the 'carrier set position', shown by the solid lines in FIG. 1. At this position, the carrier 11, which has been transported either manually or by means of an automated transporter, is loaded onto the carrier base 14. When a command to move to the 'wafer exchange position' is given (S1), the pressure transducer 28 switches ON the electromagnetic valve 29L (S2), and the air cylinder 20 is connected to the air source 25 via the low pressure regulator 27L. Subsequently, the air cylinder 20 operates under low pressure (S3), and the carrier base 14 moves towards the opening 16, together with the carrier 11. In this state, since the carrier base 14 moves by means of a small force, the carrier base 14 can be forcefully halted, e.g., if a hand is caught in between the carrier base 14 and the equipment 13.

When the carrier base 14 moves further towards opening 16, and the sensor 23 detects the movement of the carrier base 14 (i.e., the sensor 23 turns ON) (S4), the high pressure electromagnetic valve 29H is switched ON by means of the pressure transducer 28 (S5). Subsequently, the air cylinder 20 is connected to the air source 25 via the high pressure regulator 27H, and the air cylinder 20 now operates under high pressure. Accordingly, the carrier base 14 moves to the 'wafer exchange position' with a large force, stopping as it comes into contact with the stopper 22b (S6). Additionally, the opening of the carrier 11 is pushed against and comes into tight contact with the circumference of the opening 16.

Subsequently, the cover of the carrier 11 is opened by a mechanism (not shown in the figures), and the opening operation of the cover 15 of the equipment 13 commences (S7). In this case, when the pressure transducer 45 switches ON the electromagnetic valve 46H (S8), the air cylinder 32 is connected to the air source 42 via the high pressure regulator 44H. Subsequently, the air cylinder 32 operates under high pressure (S9), and opens to the predetermined position. The air cylinder 31 is then operated, and the cover 15 is removed from the opening 16, descending to a position where it will not interfere with the removal of the wafer 12 (S10). The opening operation of the cover 15 is completed at the point when the cover 15 descends to the aforementioned predetermined position (S11).

In the following, the closing operation of the cover 15, shown in FIG. 2 (b), is described. When a command to close the cover 15 is given, the cylinder 31 is operated, and the cover 15 ascends to a predetermined position (S12). Subsequently, when the pressure transducer 45 switches ON the electromagnetic valve 46L (S13), the air cylinder 32 is connected to the air source 42 via the low pressure regulator 44L. As a result, the air cylinder 32 operates under low pressure (S14), and rotates the cover 15 and the air cylinder 31 in the direction to close the opening 16 with the cover 15. Additionally, when the cover 15 is closed to a position detected by means of the sensor 38 (S15), the electromagnetic valve 46H is switched ON by means of the pressure transducer 45 (S16). Accordingly, the air cylinder 32 operates under high pressure, and the cover 15 moves to the position to close the opening 16 (S17).

Upon complete closure of opening 16 by cover 15, the pressure transducer valve 28 switches ON the electromagnetic valve 29H (S18). Subsequently, the air cylinder 20 operates under high pressure (S19), and the carrier base 14 begins moving towards the 'carrier set position'. Additionally, when the sensor 23 is switched OFF (S20), the pressure transducer 28 switches ON the electromagnetic valve 29L (S21). Accordingly, the air cylinder 20 operates under low pressure, and the carrier base 14 is returned to the 'carrier set position' with a small force (S22 and S23). Subsequently, the carrier 11 is exchanged at the 'carrier set position', and the same operation is repeated.

In this system, when transporting the carrier 11 from the 'carrier set position' to the 'carrier exchange position', it is possible to move the carrier 11 and the carrier base 14 with a small force, such that they are easily halted over the interval in which a hand or the like may be caught in between the carrier base 14 and the equipment 13. According to this system, the carrier 11 and the carrier base 14 are then to moved to their final position with a large force after the possibility of catching a hand or the like no longer exists. In this manner, it is possible to station the carrier 11 at the predetermined position using a predetermined pressure. Additionally, when closing the opening 16 with the cover 15, it is possible to move the cover 15 with a small force, such that it is easily halted over the interval in which a hand or the like may be caught in between the cover 15 and the equipment 13. The cover 15 is moved to its final position with a large force after the possibility of catching a hand or the like no longer exists. In this manner, it is possible to close the opening 16 with the cover 15 under a predetermined pressure. As a result, according to this system, it is possible to improve the safety at the load port, while maintaining the predetermined properties and performance (e.g., air-tightness of the equipment 13, etc.).

Second Embodiment

Figure 3:
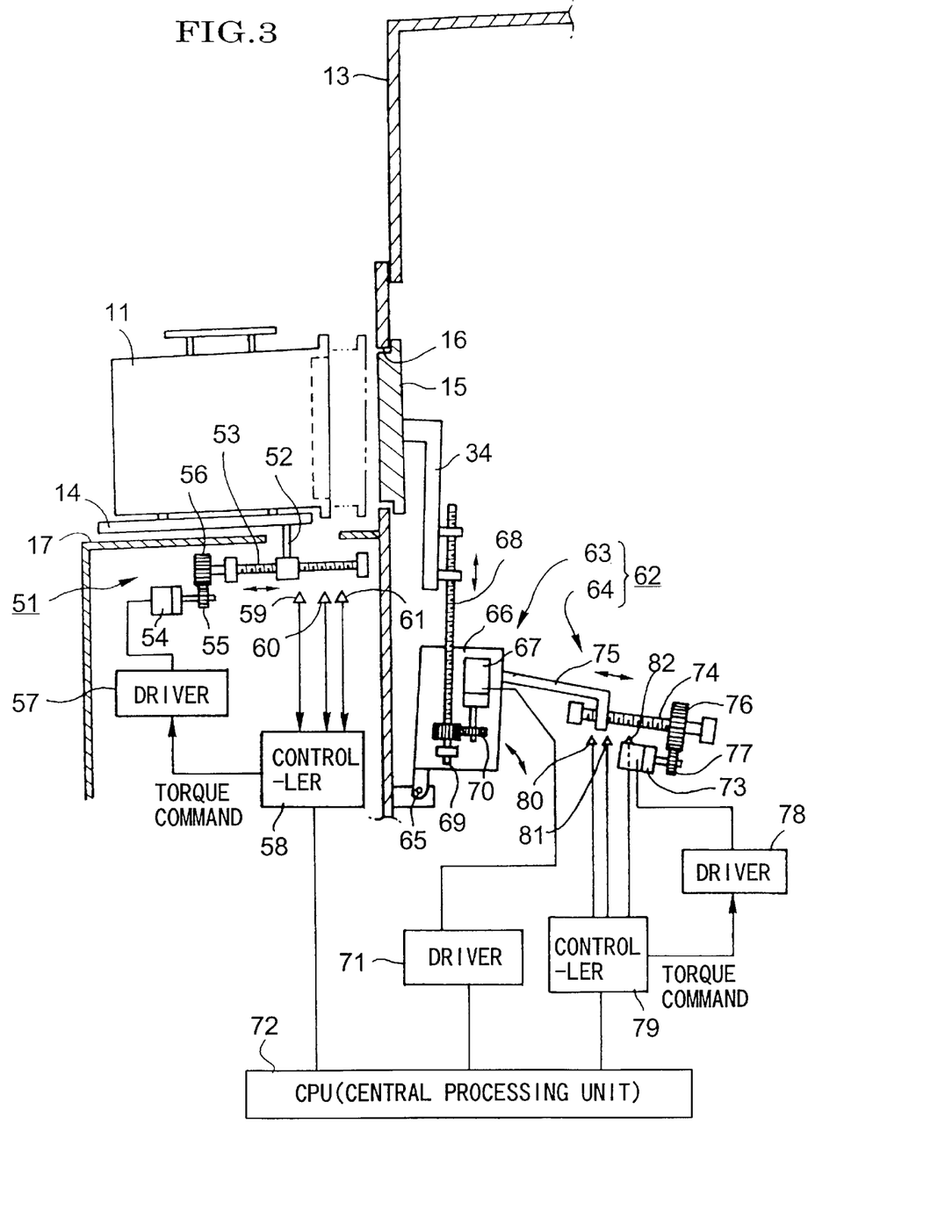
FIG. 3 is a diagram showing the structural outline of a load port for semiconductor manufacturing equipment according to a second embodiment of the present invention.

FIG. 3 is a diagram showing the structural outline of a load port for semiconductor manufacturing equipment according to a second embodiment of the present invention. The structural elements that are identical to those in the first embodiment are described using the same reference numbers.

In FIG. 3, an opening 16, which is opened or closed with a cover 15, is provided on the front surface of equipment 13. A carrier base 14, onto which carrier 11 is loaded while accommodating a wafer 12, is provided on an fixed base 17 at the front of the opening 16. The carrier base 14 is connected to a rod 52 extending from a carrier base transporting means 51, which is provided under the fixed base 17. This carrier base 14 is movable in the forward and reverse directions, together with the rod 52.

The carrier base transporting means 51 comprises a rotational screw 53 which moves the rod 52 in the forward and reverse directions by means of rotating; a decelerating gear equipped motor 54 as a driving source for rotating the screw 53; and gears 55 and 56 which transmit power between the aforementioned decelerating gear-quipped motor 54 and the screw 53. The decelerating gear-equipped motor 54 is controlled by means of a carrier base drive control means 58 via a driver 57. In addition, signals are inputted to the carrier base drive control means 58 from sensors 59, 60, and 61. Among the sensors 59, 60, and 61, the sensor 59 is switched ON when the carrier base 14 is positioned at the 'carrier set position'. The sensor 60 is switched ON when the carrier base 14 approaches a position immediately anterior to the 'carrier exchange position', i.e., a position at which it is no longer possible for hands and the like to fit in between the carrier 11 and the equipment 13. The sensor 61 is switched ON when the carrier base 14 reaches the 'carrier exchange position'.

The driver 57 can be switched alternatively between a state in which the decelerating gear-equipped motor 54 is able to rotate at a torque with a large output (i.e., high torque), and a state in which the motor 54 is able to rotate at a torque with a small output (i.e., low torque). This switch is performed upon receipt of a torque command, given by the carrier base drive control means 58. Additionally, the carrier base drive control means 58 is controlled by means of a CPU 72. When the decelerating gearequipped motor 54 operates at a torque with a small output, the carrier base 14 moves with a small force, such that the movement of the carrier base 14 can be manually halted. On the other hand, when the decelerating gear-equipped motor 54 operates at a torque with a large output, the carrier base 14 receives a force greater than that required to keep the gas within equipment 13 from leaking at the time when the opening of carrier 11 is brought into tight contact with the aforementioned opening 16. The specific magnitude of these forces is optionally determined.

In the following, the cover 15 is described. The cover 15 is connected to a rod 34 extending from a cover moving means 62, provided in the equipment 13, and hence is movable together with the rod 34. The cover moving means 62 comprises a vertical movement driving means 63 which moves the cover 15 in the vertical direction; and a horizontal movement driving means 64 which moves the vertical movement driving means 63 in the forward and reverse directions, together with the cover 15.

The vertical movement driving means 63 comprises a base 66 which rotates on an axle 65 as a fulcrum in the forward and reverse directions; a decelerating gear-equipped motor 67, provided on the base 66; a rotational screw 68; and gears 69 and 70 which transmit the driving force from the decelerating gear-equipped motor 67 to the rotational screw 68. When the decelerating gear-equipped motor 67 is driven, thereby rotating the aforementioned rotational screw 68, the rod 34 moves along with the screw by means of this rotation, resulting in movement of the cover 15 in the vertical direction. The decelerating gear-equipped motor 67 is controlled by means of the CPU 72 via the driver 71.

The horizontal movement driving means 64 comprises a decelerating gear-equipped motor 73; a rotational screw 74; a rod 75, which is moved by means of rotating the aforementioned rotational screw 74; and gears 76 and 77, which transmit the driving of the decelerating gear-equipped motor 73 to the rotational screw 74. The decelerating gear-equipped motor 73 is controlled by means of a cover drive control means 79 via a driver 78. Additionally, signals are inputted to the cover drive control means 79 from sensors 80, 81, and 82. Among the sensors 80, 81, and 82, the sensor 80 is switched ON when the cover 15 is positioned at the 'closing position'. The sensor 81 is switched ON when the cover 15 approaches a position immediately anterior to the 'closing position', i.e., a position at which it is no longer possible for hands and the like to fit in between the cover 15 and the equipment 13. The sensor 82 is switched ON when the cover 15 reaches the final opening position.

The driver 78 can be switched alternatively between the state in which the decelerating gear-equipped motor 73 is able to rotate at a torque with a large output (i.e., high torque), and the state in which the motor 73 is able to rotate at a torque with a small output (i.e., low torque). This switch is performed upon receipt of a torque command, given by the cover drive control means 79. Additionally, the cover drive control means 79 is controlled by means of the CPU 72. When the decelerating gear-equipped motor 73 operates at a torque with a small output, the cover 15 moves with a small force, such that the movement can be manually halted. On the other hand, when the decelerating gear-equipped motor 73 operates at a torque with a large output, the cover receives a force greater than that required to keep the gas within equipment 13 from leaking at the time of closing the opening 16 with the cover 15. The specific magnitude of these forces is optionally determined.

Furthermore, the aforementioned carrier base drive control means 58; the vertical movement driving means 63; the horizontal movement driving means 64; the drivers 71 and 78; the controller 79; and the like, are controlled by means of a program that is pre-installed in the CPU 72.

Figure 4:
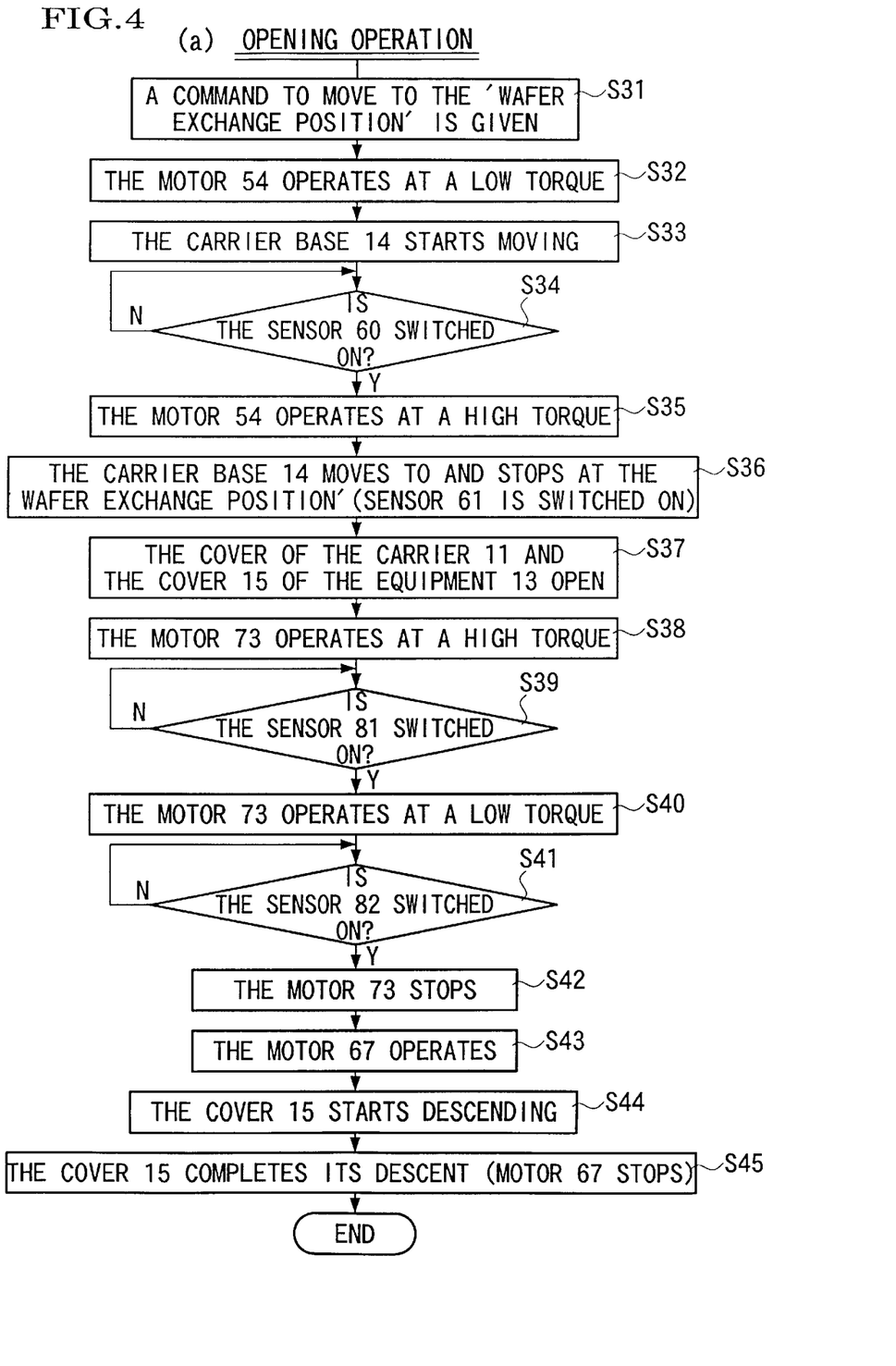

FIGS. 4 (a) and 4 (b) are flow charts, showing an example of such program. The operation of each structure in the aforementioned system is described using FIGS. 4 (a) and 4 (b).

First, the opening operation of the cover 15, shown in FIG. 4 (a), is described. The carrier base 14 is initially positioned at the 'carrier set position', shown by the solid lines in FIG. 3. At this position, the carrier 11, which has been transported either manually or by an automated transporter, is loaded onto the carrier base 14. In this state, the sensor 59 detects the rod 52. When the controller 58 receives a command to move the carrier base 14 to the 'wafer exchange position' (S31), the controller 58 provides a command to the driver 57 to operate the decelerating gear-equipped motor 54 at a low torque. Accordingly, the decelerating gear-equipped motor 54 operates at a low torque (S32), and the movement of the carrier base 14 to the 'wafer exchange position' commences (S33). In this state, since the carrier base 14 moves with a small force, it is possible to halt the movement of the carrier base 14 forcefully, for example in the case of catching a hand in between the carrier base 14 and the equipment 13.

Upon detecting the continued movement of the carrier base 14 via sensor 60 (i.e., the sensor 60 is switched ON)

(S34), the controller 58 gives a command to the driver 57 to operate the decelerating gear-equipped motor 54 at a high torque. Accordingly, the decelerating gear-equipped motor 54 operates at a high torque (S35), and the carrier base 14 moves to the 'wafer exchange position' with a large force. When the carrier base 14 reaches the 'exchange position', the sensor 61 is switched ON, and operation of the decelerating gear-equipped motor 54 is halted (S36). Additionally, the opening of the carrier 11 is pushed against and into tight contact with the circumference of the opening 16.

Subsequently, as the cover of the carrier 11 is opened by a mechanism (not shown in the figures), the cover 15 of the equipment 13 begins the opening operation (S37). Subsequently, the decelerating gear-equipped motor 73 operates at a high torque (S38), and the cover 15 is opened with a large force. Furthermore, when the sensor 81 switches ON (S39), the controller 79 provides the driver 78 with a command to the driver 78 to operate the decelerating gear-equipped motor 73 at a low torque. Accordingly, the decelerating gear-equipped motor 73 opens the cover 15 to the predetermined position while operating at a low torque (S40). Additionally, when the sensor 82 switches ON (S41), operation of the decelerating gear-equipped motor 73 is halted (S42). Subsequently, the decelerating gear-equipped motor 67 operates (S43), and the cover 15 begins its descent (S44). At a point when the cover 15 is removed from the opening 16 to a position where it will not interfere with the removal of the wafer 12, operation of the decelerating gear-equipped motor 67 is halted, which completes the opening operation of the cover 15 (S45).

In the following, the closing operation of the cover 15, shown in FIG. 4 (b), is described. When a command to close the cover 15 is given, the decelerating gear-equipped motor 67 operates (S51), and stops when the cover 15 ascends to a predetermined position (S52). Subsequently, the decelerating gear-equipped motor 73 takes over and operates at a low torque, thereby moving the cover 15 towards the closing position (S53). In addition, when the sensor 81 is switched ON (S54), the aforementioned decelerating gear-equipped motor 73 operates at a high torque (S55), and the cover 15 moves further towards the opening 16. When the cover 15 moves to a position which will close the opening 16, and the sensor 80 is switched ON (S56), the decelerating gear-equipped motor 73 then stops (S57).

When the cover 15 completely closes the opening 16, the decelerating gear-equipped motor 54 operates at a high torque (S58), and the carrier base 14 moves in a direction towards the 'carrier set position' (S59). Furthermore, when the sensor 60 is temporarily switched ON (S60), the decelerating gear-equipped motor 54 is switched to the low torque (S61), and the carrier base 14 moves further towards the aforementioned 'carrier set position'. When the carrier base 14 is returned to the 'carrier set position', the sensor 59 is switched ON (S63), and the decelerating gear-equipped motor 54 stops (S64), which completes the movement of the carrier base 14 (S65).

Subsequently, the carrier 11 is exchanged at the 'carrier set position', and the same operation is repeated.

Consequently, according to the structure of the second embodiment, when transporting the carrier 11 from the 'carrier set position' to the 'carrier exchange position', it is possible to move the carrier 11 and the carrier base 14 with a small force, such that they are easily halted over the interval in which a hand or the like may be caught in between the carrier base 14 and the equipment 13. According to this system, the carrier 11 and the carrier base 14 are then to moved to their final position with a large force after the possibility of catching a hand or the like no longer exists. In this manner, it is possible to station the carrier 11 at the predetermined position using a predetermined pressure. Additionally, when closing the opening 16 with the cover 15, it is possible to move the cover 15 with a small force, such that it is easily halted over the interval in which a hand or the like may be caught in between the cover 15 and the equipment 13. The cover 15 is then moved to its final position with a large force after the possibility of catching a hand or the like no longer exists. In this manner, it is possible to close the opening 16 with the cover 15 under a predetermined pressure. As a result, according to this system, it is possible to improve the safety at the load port, while maintaining the predetermined properties and performance.

Figure 5:
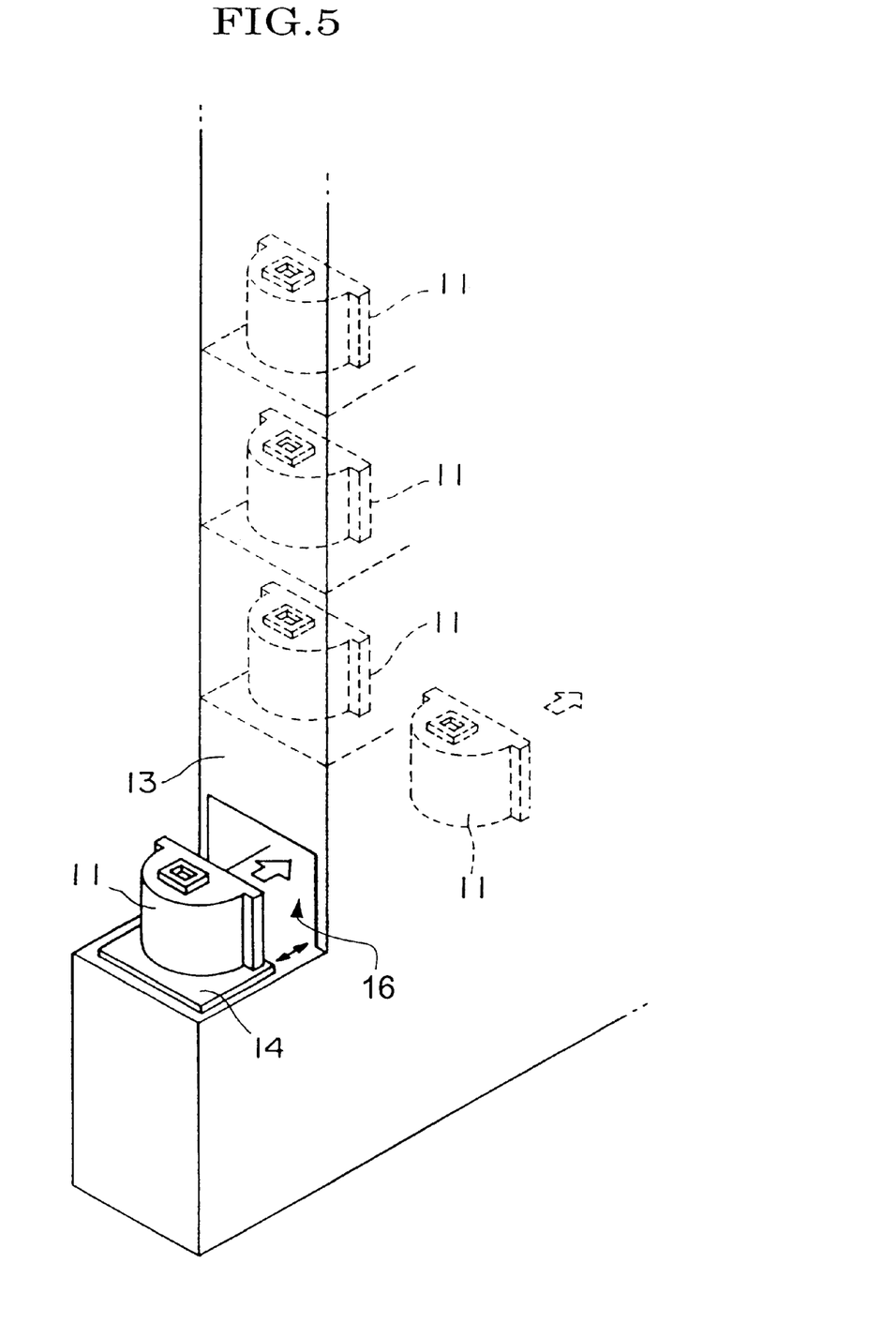
FIG. 5 is a cross-sectional view showing a load port according to an embodiment of the present invention.

FIG. 5 shows an embodiment of a load port, according to the present invention. This load port handles a FOUP type carrier 11 with its cover attached. In the figure, by means of providing a plurality of shelves inside of the load port, the load port can accommodate a plurality of carriers 11, brought in through the opening 16 which opens/closes using a door, by arranging them vertically. In such a manner, by means of accommodating a plurality of carriers 11 within, the load port may also function as a buffer to store carriers into the semiconductor manufacturing equipment.

Figure 6:
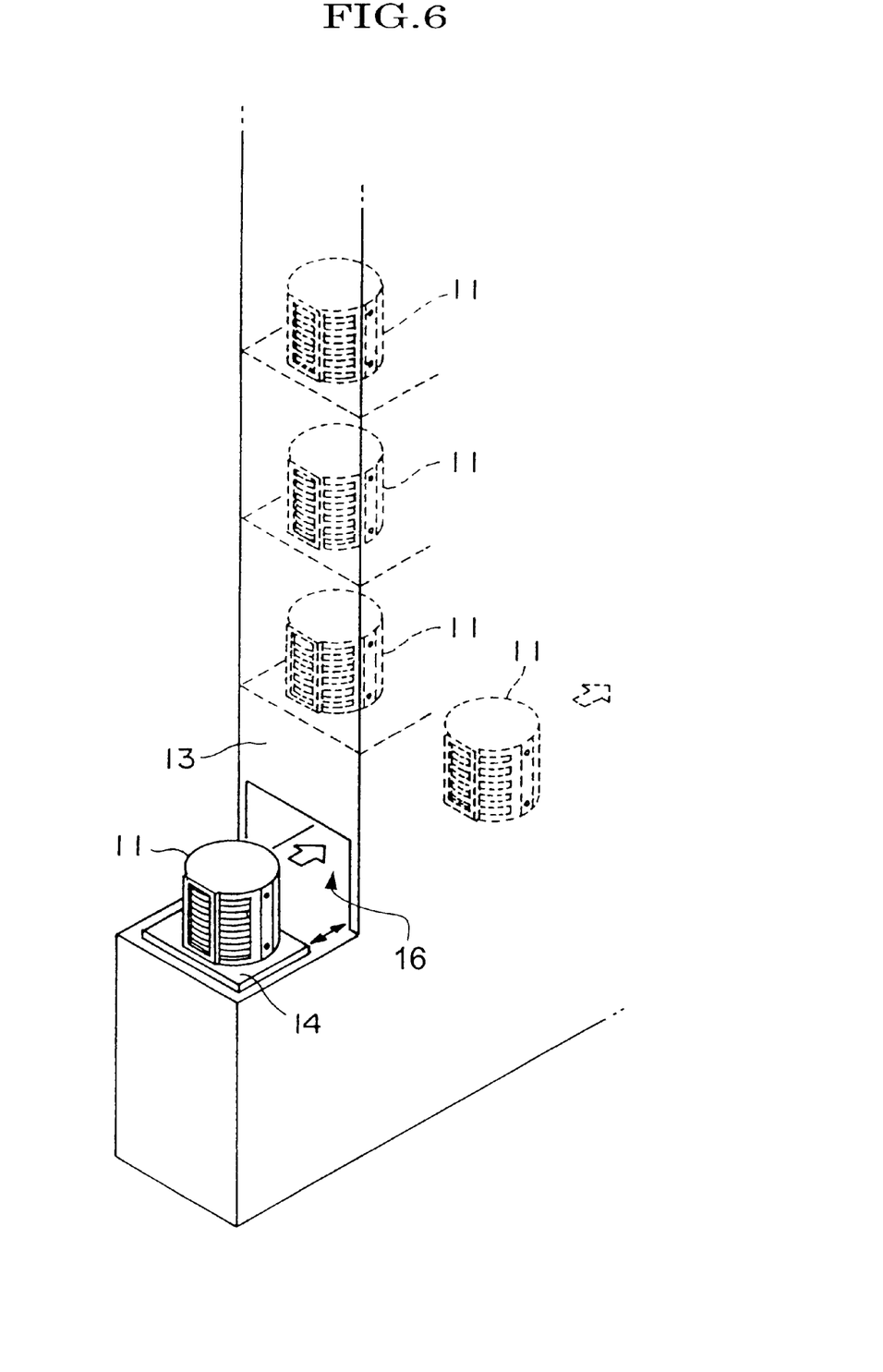
FIG. 6 is a cross-sectional view showing a load port according to another embodiment of the present invention.

FIG. 6 shows another embodiment of a load port according to the present invention. This load port handles an OC type carrier 11, and can accommodate a plurality of carriers 11 by means of arranging them vertically, in the same manner as in the load port shown in FIG. 5.

In each of the aforementioned embodiments, in order to change the magnitude of the force used in moving the carrier base 14 and opening/closing the cover 15, procedures for changing the magnitude of the force by means of directly controlling the air cylinder or the motor are disclosed. However, the present invention is not limited to these methods, and may employ a method for changing the magnitude of the forces by means of mechanical switching, and the like.

Additionally, each of the aforementioned embodiments describes the present invention when simultaneously applied to transportation for both the carrier base 14 and the cover 15; however, the present invention may be applied to transportation for either of these components separately.

What is claimed is:

1. A load port for semiconductor manufacturing equipment comprising:
    a carrier for accommodating a wafer;
    a carrier base for transporting said carrier, while accommodating a wafer, towards an opening of said semiconductor manufacturing equipment to close said opening;
    a transporting means for transporting said carrier base; and
    control means to control said transporting means to transport said carrier base toward said opening using a relatively small force until said carrier reaches a predetermined position at a predetermined distance from said opening and then transport said carrier base towards said opening using a force greater than said small force used to move said carrier base to said predetermined position.

2. A load port according to claim 1, wherein said carrier base transporting means comprises a cylinder to transport said carrier base; a source to provide a driving force pressure for said cylinder; and a pressure regulating means for regulating the pressure provided from said source to said cylinder.

3. A load port according to claim 2, wherein said pressure regulating means regulates the output of said cylinder between a low output to move said carrier base with the smaller force, and a high output to move said carrier base with a larger force.

4. A load port according to claim 1, wherein said carrier base transporting means further comprises a motor which functions as a driving source; a rotational screw which rotates with said motor; a transport member which moves along with said carrier base, by means of rotating said rotational screw; and a controller for switching the output of said motor to achieve said small force and larger force.

5. A load port for semiconductor manufacturing equipment comprising:

an opening in said equipment for taking in a wafer;

a cover for freely opening and closing said opening;

a cover moving means for moving said cover; and control means to control said cover moving means to move said cover toward said opening using a relatively small force until said cover reaches a predetermined position at a predetermined distance from completely closing said opening and then to move said cover to completely close said opening using a large force which is greater than said small force used to move said cover to said predetermined position.

6. A load port according to claim 5, wherein said cover moving means comprises a cylinder to move said cover; a driving means to provide a driving force pressure for said cylinder; and a pressure regulating means for regulating the pressure provided from said driving means to said cylinder.

7. A load port according to claim 6, wherein said pressure regulating means regulates the force output of said cylinder between a low output to move said cover with the smaller force, and a high output to move said cover with the larger force.

8. A load port according to claim 5, wherein said cover moving means further comprises a motor which functions as a driving source; a rotational screw which rotates with said motor; a transport member which moves along with said cover by means of rotating said rotational screw; and a controller for switching the output torque of said motor to achieve said small force and said large force.

9. A load port for semiconductor manufacturing equipment comprising:

a carrier for accommodating a wafer;

a carrier base for transporting said carrier, while accommodating a wafer;

a transporting means for transporting said carrier base towards an opening of said semiconductor manufacturing equipment;

control means to control said transporting means to transport said carrier base toward said opening using a relatively small force until said carrier reaches a predetermined position at a predetermined distance from said opening and then transport said carrier base towards said opening using a force greater than said small force used to move said carrier base to said predetermined position;

a cover on a side of said equipment opposite to said carrier and carrier base for freely opening and closing said opening;

a cover moving means for moving said cover; and control means to control said cover moving means to move said cover toward said opening using a relatively small force until said cover reaches a predetermined position at a predetermined distance from completely closing said opening, and then to move said cover to completely close said opening using a large force which is greater than said small force used to move said cover to said predetermined position.

* * * * *